US008898050B2

(12) United States Patent
Lo et al.

(10) Patent No.: US 8,898,050 B2
(45) Date of Patent: Nov. 25, 2014

(54) STATIC IR (VOLTAGE) DROP ANALYZING APPARATUS AND ASSOCIATED METHOD

(75) Inventors: Chen-Hsing Lo, Hsinchu Hsien (TW); Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 1001 days.

(21) Appl. No.: 12/956,474

(22) Filed: Nov. 30, 2010

(65) Prior Publication Data

US 2011/0153303 A1  Jun. 23, 2011

(30) Foreign Application Priority Data

Dec. 22, 2009  (TW) .............................. 098144159 A

(51) Int. Cl.
  *G06F 17/50*  (2006.01)
(52) U.S. Cl.
  CPC .................................. *G06F 17/5036* (2013.01)
  USPC ........................................................... 703/14
(58) Field of Classification Search
  CPC .................................................. G06F 17/5036
  USPC ........................................................... 703/14
  See application file for complete search history.

(56) References Cited

U.S. PATENT DOCUMENTS 7,852,113 B2 * 12/2010 Terzioglu et al. ............... 326/33
2005/0276132 A1 * 12/2005 Severson et al. ............. 365/202
2006/0027878 A1 * 2/2006 Chinthakindi et al. ....... 257/379

OTHER PUBLICATIONS

Yu-Wen Tsai, "IR-Drop Analysis Flow for MTCMOS Design," presentation slides and paper, 2005, cdnLive 2005 conference, 36 pages.*
Puneet Gupta et al., "Lithography Simulation-Based Full-Chip Design Analyses," 2006, Design and Process Integration for Microelectronic Manufacturing IV, Edited by Wong, Alfred K. K.; Singh, Vivek K. Proceedings of the SPIE, vol. 6156, pp. 277-284.*
Sachin Idgunji, "Case study of a low power MTCMOS based ARM926 SoC: Design, Analysis and Test Challenges," 2007, 2007 IEEE International Test Conference, pp. 1-10.*
Huang Huang et al., "Multicore processor cluster based sleep transistor sizing considering delay profile," 2009, IEEE 8th International Conference on ASIC, pp. 654-657.*
Ehsan Pakbaznia et al., "Coarse-Grain MTCMOS sleep transistor sizing using delay budgeting," 2008, Design, Automation and Test in Europe, six pages.*
Yijia Xu et al., "An MTCMOS power network design flow," 2009, 1st Asia Symposium on Quality Electronic Design 2009, four pages.*

* cited by examiner

*Primary Examiner* — Kamini S Shah
*Assistant Examiner* — Russ Guill
(74) *Attorney, Agent, or Firm* — WPAT, PC; Justin King

(57) ABSTRACT

A static voltage drop analyzing apparatus applied to a Multi-Threshold Complementary Metal-Oxide-Semiconductor (MTCMOS) transistor is provided. The static voltage drop analyzing apparatus includes a calculating module, a processing module, and a measuring module. The calculating module calculates a voltage drop tolerance according to the voltage drop characteristic of the MTCMOS transistor. The processing module selects a simulation metal layer corresponding to the voltage drop tolerance from a plurality of candidate simulation metal layers, and adds the simulation metal layer into the MTCMOS transistor. The measuring module measures the voltage drop of the simulation metal layer added into the MTCMOS transistor. The measured voltage drop of the simulation layer added into the MTCMOS is substantially the static voltage drop of the MTCMOS transistor.

11 Claims, 8 Drawing Sheets

```
AN2 Inst1(.A(N1), .B(N2), .Y(N3), \
          .VDD(SwitchedVDD), .VSS(VSS));
INV Inst2(.A(N1), .Y(N3), \
          .VDD(SwitchedVDD), .VSS(VSS));
...
...
```

FIG. 7A

```
AN2 Inst1(.A(N1), .B(N2), .Y(N3), \
          .VDD(ConstantVDD), .VSS(VSS));
INV Inst2(.A(N1), .Y(N3), \
          .VDD(ConstantVDD), .VSS(VSS));
...
...
```

FIG. 7B

STATIC IR (VOLTAGE) DROP ANALYZING APPARATUS AND ASSOCIATED METHOD

CROSS REFERENCE TO RELATED PATENT APPLICATION

This patent application is based on Taiwan patent application No. 098144159 filed on Dec. 22, 2009.

FIELD OF THE INVENTION

The present invention relates to power gating techniques, and more particularly, to a static IR (voltage) drop analyzing apparatus and associated method for accurately measuring static IR (voltage) drop of a multi-threshold complementary metal-oxide-semiconductor (MTCMOS) transistor without implementing special, costly analyzing tools.

BACKGROUND OF THE INVENTION

To match up with well-developed IC fabrication processes (e.g., 0.13 µm processes) for application specific integrated circuit (ASIC) and system-on-chip (SoC) circuitry designs, wafer manufacturers are introducing new materials and manufacturing techniques in order to produce smaller integrated circuits with faster speeds. However, accompanied with smaller process scales, scaled thresholds and unscaled voltages, issues of more severe current leakage and static power consumption have arisen.

For IC manufacturing processes of, e.g., 90 µm and below 65 µm, power management stands as a crucial factor that is looked into during the design process. To effectively respond to difficulties in power management, various techniques including multi-threshold, multi-voltage, clock gating and power gating have been adopted for reducing static power consumption of circuits.

A power gating circuit of a mobile device is generally provided with MTCMOS transistors consisted of a positive channel metal-oxide-semiconductor (PMOS) or a negative channel metal-oxide semiconductor (NMOS). An MTCMOS transistor accomplishes power gating by separating constant VDD and switched VDD to turn off functions module that are temporarily idle in the mobile device so as to noticeably reduce static power consumption.

FIGS. 1A and 1B respectively show schematic diagrams of two different power gating circuits. As shown, a power gating circuit 1 comprises a PMOS component 10 and a power gating circuit 1' comprises a PMOS components 11 and 12, and both circuits comprise both a constant VDD and a switched VDD.

Refer to FIGS. 2A and 2B respective showing a schematic diagram of a circuit layout of a common power gating circuit, which includes the layout of a gate terminal G, source terminal S, drain terminal D, and a sectional diagram of an MTCMOS transistor 20 obtained along a dotted line L in FIG. 2. It is observed from FIG. 2B that, the MTCMOS transistor 20 accomplishes power gating by separating the constant VDD and the switched VDD; that is, there is no coupling between the constant VDD and the switched VDD, and such absence of coupling results in complications for static IR (voltage) drop of the MTCMOS 20.

Static IR (voltage) drop of an MTCMOS transistor can be analyzed by Electronic Design Automation (EDA) tools, which are quite costly and a heavy burden on IC designers or IC manufacturers.

Therefore, it is an objective of the invention to provide a static IR (voltage) drop analyzing apparatus and associated method for solving the foregoing issue.

SUMMARY OF THE INVENTION

A static IR (voltage) drop analyzing apparatus is provided according to a first embodiment of the invention. In this embodiment, the static IR (voltage) drop analyzing apparatus, applied to a multi-threshold complementary metal-oxide-semiconductor (MTCMOS) transistor, comprises an estimation module, a processor and a measuring module. The estimation module estimates an IR (voltage) drop tolerance according to IR (voltage) drop characteristics of the MTCMOS transistor. The processor selects a simulation metal layer from a plurality of candidate simulation metal layers according to the IR (voltage) drop tolerance, and adds the simulation metal layer to the MTCMOS transistor. The measuring module measures an IR (voltage) drop of the simulation metal layer added to the MTCMOS transistor. The IR (voltage) drop measured by the measuring module is substantially equal to a static IR (voltage) drop of the MTCMOS transistor.

A static IR (voltage) drop analyzing method is provided according to a second embodiment of the invention. In this embodiment, the static IR (voltage) drop method, applied to an MTCMOS transistor, comprises estimating an IR (voltage) drop tolerance according to IR (voltage) drop characteristics of the MTCMOS transistor, selecting a simulation metal layer from a plurality of candidate simulation metal layers according to the IR (voltage) drop tolerance and adding the selected simulation metal layer to the MTCMOS transistor, and measuring an IR (voltage) drop of the simulation metal layer added to the MTCMOS transistor. The measured IR (voltage) drop is substantially equal to a static IR (voltage) drop of the MTCMOS transistor.

According to the static IR (voltage) drop analyzing apparatus and associated method of the invention, an IR (voltage) drop tolerance of the MTCMOS transistor is first estimated with a common Simulation Program with Integrated Circuit Emphasis (SPICE) tool, and a simulation metal layer corresponding to the estimated IR (voltage) drop tolerance is then added to the MTCMOS transistor, so that originally separated constant VDD and switched VDD become coupled and shorted via the simulation metal layer to allow accurate measurement of the static IR (voltage) drop of the MTCMOS transistor.

Therefore, with the aid of a common EDA tool, the static IR (voltage) drop analyzing apparatus and associated method provided by the invention is capable of accurately measuring the static IR (voltage) drop of the MTCMOS transistor, thereby saving significant additional cost previous required for particular analyzing software tools as in the prior art.

BRIEF DESCRIPTION OF THE DRAWINGS

The present invention will become more readily apparent to those ordinarily skilled in the art after reviewing the following detailed description and accompanying drawings, in which:

FIGS. 7A and 7B respectively show netlists before and after changing the power supply connected to the power pin VDD;

DETAILED DESCRIPTION OF THE PREFERRED EMBODIMENT

A static IR (voltage) drop analyzing apparatus is provided according to a first embodiment of the invention. In this embodiment, the static IR (voltage) drop analyzing module analyzes a static IR (voltage) drop of a multi-threshold complementary metal-oxide-semiconductor (MTCMOS) transistor in a power gating circuit disposed in an electronic device such as a mobile communication device. For example, the use of the power gating circuit is for turning off various function modules (e.g., a communication module, a message module or a game module) that are temporarily not use in the electronic device so as to reduce an overall power consumption.

Figure 1A:
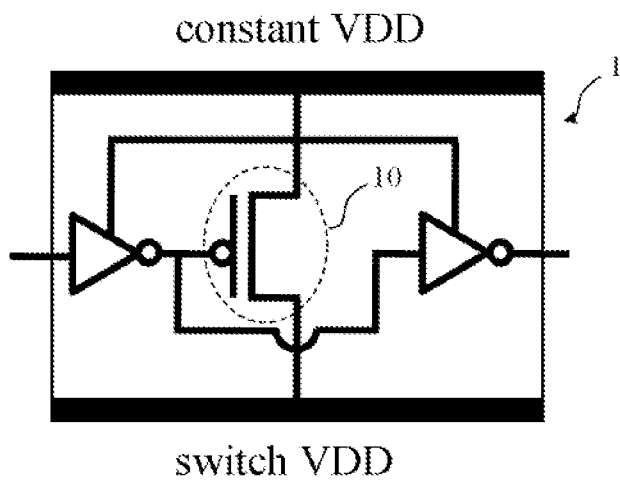
FIGS. 1A and 1B show schematic diagrams of two different common power gating circuits.
Figure 1B:
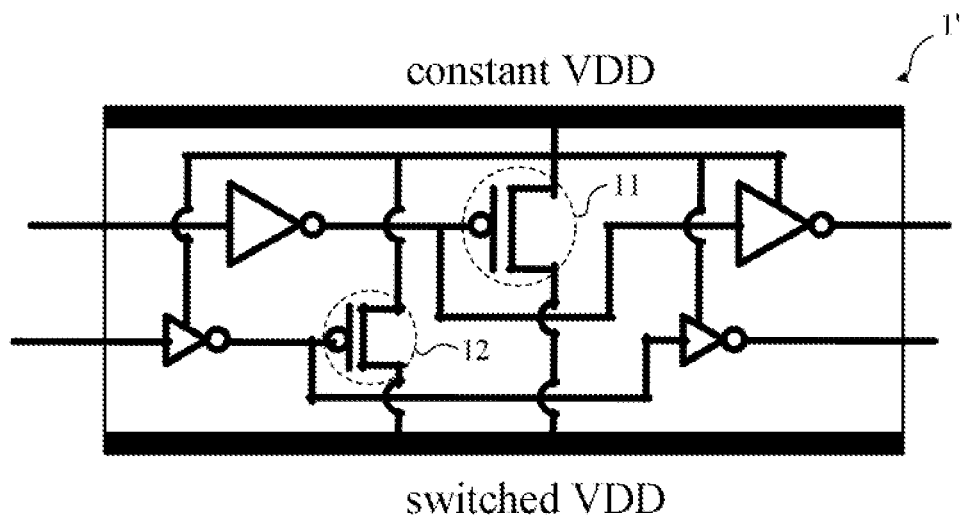
Figure 2A:
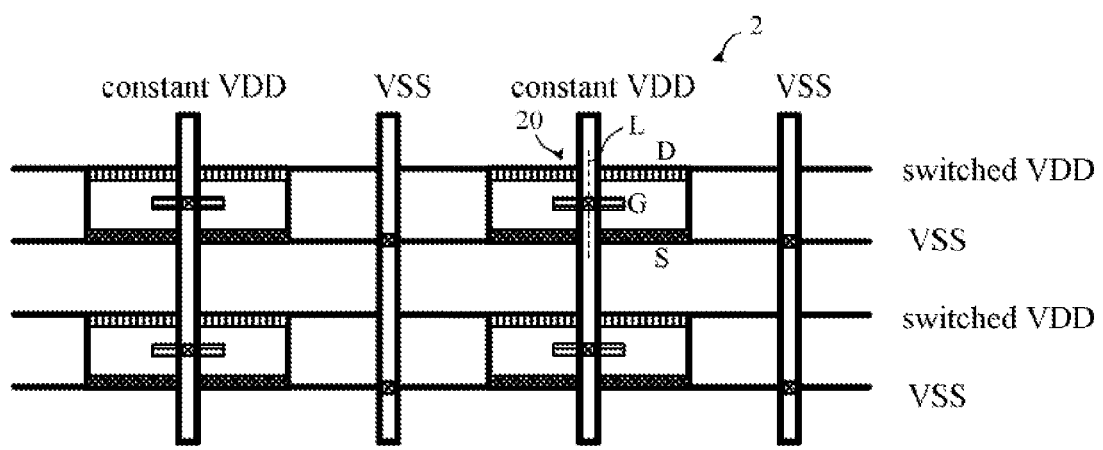
FIGS. 2A and 2B respectively show a schematic diagram of a circuit layout of a common power gating circuit, and a sectional diagram of an MTCMOS transistor 20 obtained along the dotted line L in FIG. 2A.
Figure 2B:
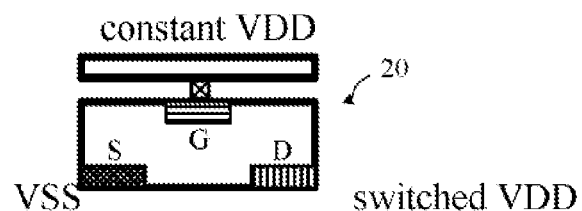
Figure 3:
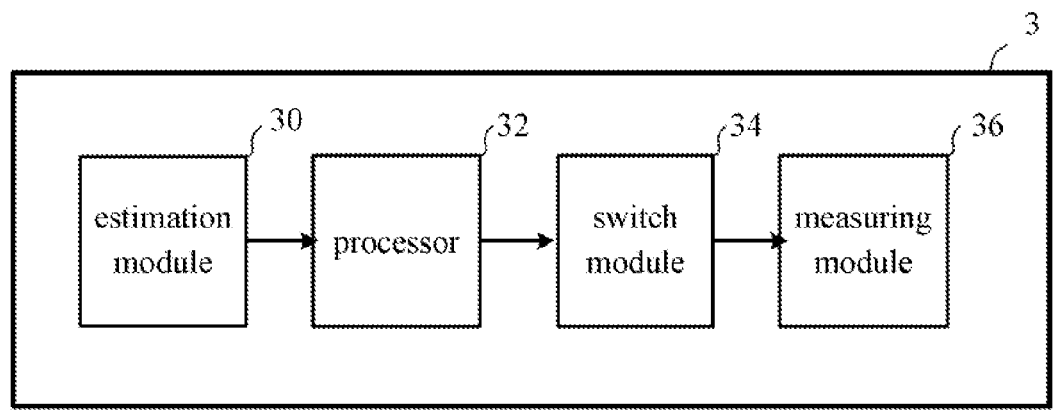
FIG. 3 is a functional block diagram of the static IR (voltage) drop analyzing apparatus according to this embodiment of the invention.

FIG. 3 shows a functional block diagram of the static IR (voltage) drop analyzing apparatus according to this embodiment of the invention. A static IR (voltage) drop analyzing module 3 comprises an estimation module 30, a processor 32, a switch module 34 and a measuring module 36, which shall be described in detail below.

In this embodiment, the estimation module 30 estimates an IR (voltage) drop tolerance according to characteristics of the MTCMOS transistor. For example, the estimation module 30 estimates the IR (voltage) drop tolerance according to characteristics of the MTCMOS transistor using a common SPICE tool, or other common known simulation tools.

The processor 32 next selects a corresponding simulation metal layer from a plurality of candidate simulation metal layers according to the IR (voltage) drop tolerance. In practice, the plurality of candidate simulation metal layers and corresponding IR (voltage) drop tolerances are pre-stored in a lookup table, which also records, for example, sizes and resistances of the various candidate simulation metal layers.

Figure 4:
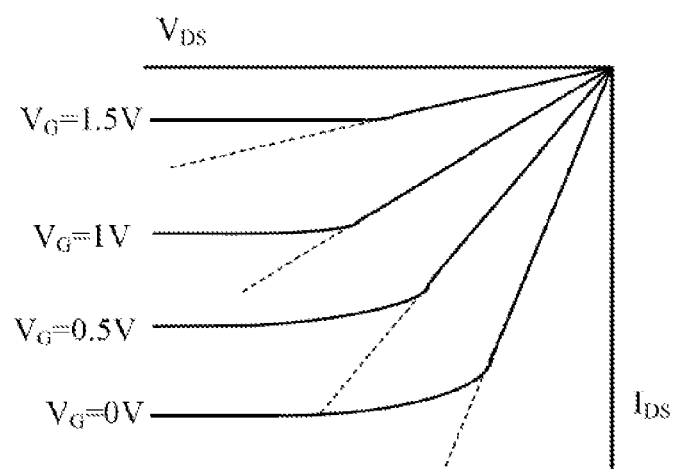
FIG. 4 is an $I_{DS}$-$V_{DS}$ characteristic curve of the MTCMOS transistor obtained through a SPICE tool.

For example, the estimation module 30 executes a common SPICE tool to obtain an $I_{DS}$-$V_{DS}$ characteristic curve of the MTCMOS transistor as shown in FIG. 4. Based on V=IR, when a gate voltage $V_G$ is constant, the resistance is R=$V_{Ds}$/$I_{DS}$, which is a reciprocal of the dotted slope. Supposing the estimation module 30 estimates an IR (voltage) drop tolerance ΔV of the MTCMOS transistor to be 3%, a simulation metal layer M corresponding to an IR (voltage) drop of 3% is selected from a plurality of recorded candidate simulation metal layers, and it is also obtained that a width and a resistance of the metal layer M are 0.06 μm and 0.067Ω, respectively.

TABLE 1

| IR (voltage) drop tolerance | Type of simulation metal layer | Width of simulation metal layer (μm) | Resistance of simulation metal layer(Ω) |
| --- | --- | --- | --- |
| 1% | N | 0.02 | 0.027 |
| 3% | M | 0.06 | 0.067 |
| 5% | N | 0.09 | 0.101 |
| 7% | M | 0.11 | 0.122 |

Figure 5A:
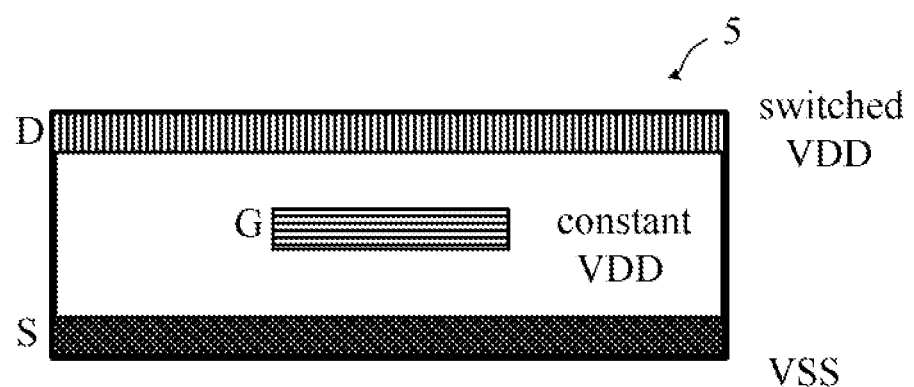
FIGS. 5A and 5B are respectively the top views of an MTCMOS transistor 5 without the addition of the simulation metal layer, and an MTCMOS transistor 5' with the addition of the simulation metal layer.
Figure 5B:
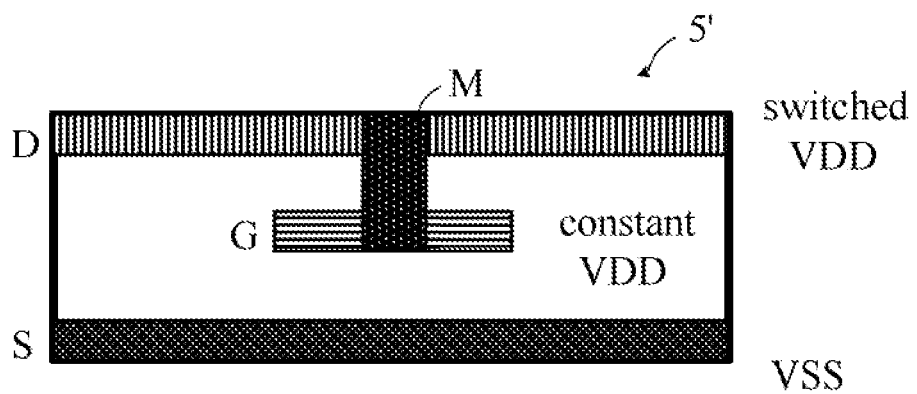

The processor 32 then adds the simulation metal layer into the MTCMOS transistor. FIGS. 5A and 5B respectively show top views of an MTCMOS transistor 5 not yet added with the simulation metal layer M and an MTCMOS transistor 5' with the simulation metal layer M added.

As shown in FIG. 5A, the MTCMOS transistor 5 comprises a switched VDD, a constant VDD and a ground voltage VSS, wherein the switched VDD is not electrically connected with the constant VDD. Under a normal mode, the constant VDD is connected to a system voltage supply; an IR (voltage) drop between the constant VDD and the switched VDD is to be measured.

Figure 6A:
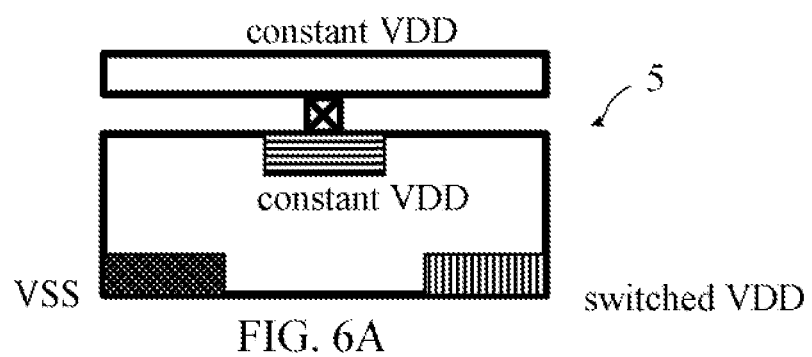
FIGS. 6A and 6B are respectively sectional views of an MTCMOS transistor not yet modified with the simulation metal layer and an MTCMOS transistor modified with the simulation metal layer.
Figure 6B:
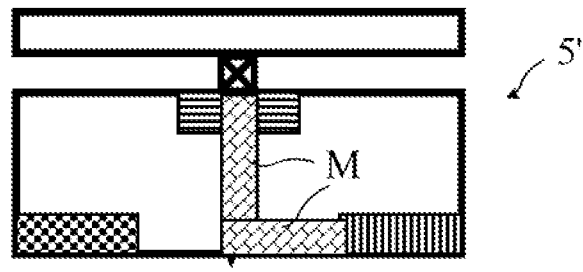

As shown in FIG. 5B, the processor 32 couples the simulation metal layer M between the constant VDD and the switched VDD, so that the constant VDD and the switched VDD originally separated from each other in FIG. 5A become coupled and shorted. Since the resistance R of the simulation metal layer is $V_{DS}$/$I_{DS}$, the simulation metal layer M in the MTCMOS transistor 5' is capable of reflecting characteristics equivalent to the IR (voltage) drop tolerance ΔV of the MTCMOS transistor 5'. FIGS. 6A and 6B show sectional views of an MTCMOS transistor 5 not yet modified with the simulation metal layer M and an MTCMOS transistor 5' with the simulation metal layer M added, respectively.

Next, the switch module 34 changes a power supply of a power pin VDD of the MTCMOS transistor 5'. FIGS. 7A and 7B respectively show the netlists before and after changing the power supply connected to the power pin VDD. As observed from FIGS. 7A and 7B, the switch module 34 changes the power supply connected to the power pin VDD of the MTCMOS transistor 5' from the switched VDD to the constant VDD.

Figure 8:
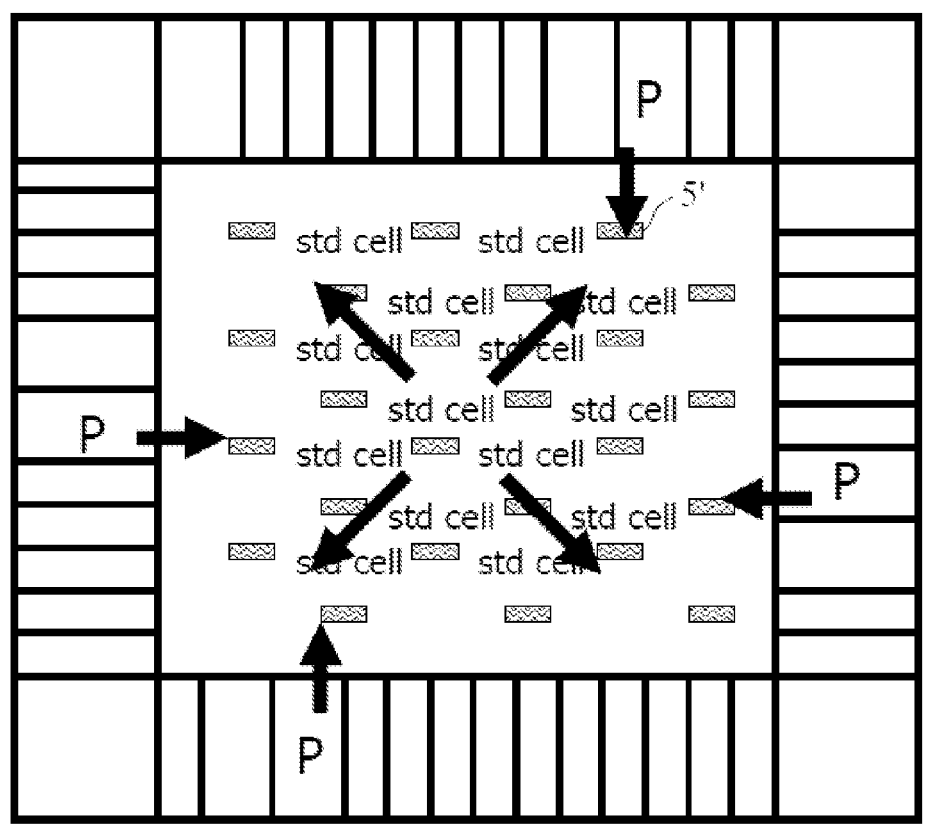
FIG. 8 is a schematic diagram of a current flowing to the MTCMOS transistor via power pads.

FIG. 8 shows a schematic diagram of a current flowing to the MTCMOS transistor via a power pad. As indicated by arrows in FIG. 8, the current between a power end and ground flows via power pads P to the MTCMOS 5', and flows to a mesh from the MTCMOS transistor 5' and then to standard cells; that is, the current between the power end and ground flows to all nodes of the mesh via the power pads P.

The measuring module 36 then measures an IR (voltage) drop of the simulation metal layer added into the MTCMOS transistor. It is to be noted that, since the constant VDD and the switched VDD are coupled and shorted through the simulation metal layer, a static IR (voltage) drop of the MTCMOS can be accurately obtained using a common EDA tool. More specifically, the IR (voltage) drop measured by the measuring module is substantially the static IR (voltage) drop of the MTCMOS transistor.

A static IR (voltage) drop analyzing method is provided according to a second embodiment of the invention. In this embodiment, the static IR (voltage) drop analyzing module is for analyzing a static IR (voltage) drop of a MTCMOS transistor in a power gating circuit, which is disposed in an electronic device such as a mobile communication device. For example, the use of the power gating circuit is for turning off function modules (e.g., a communication module, a message module or a game module) that are temporarily not use in the electronic device so as to reduce an overall power consumption.

Figure 9:
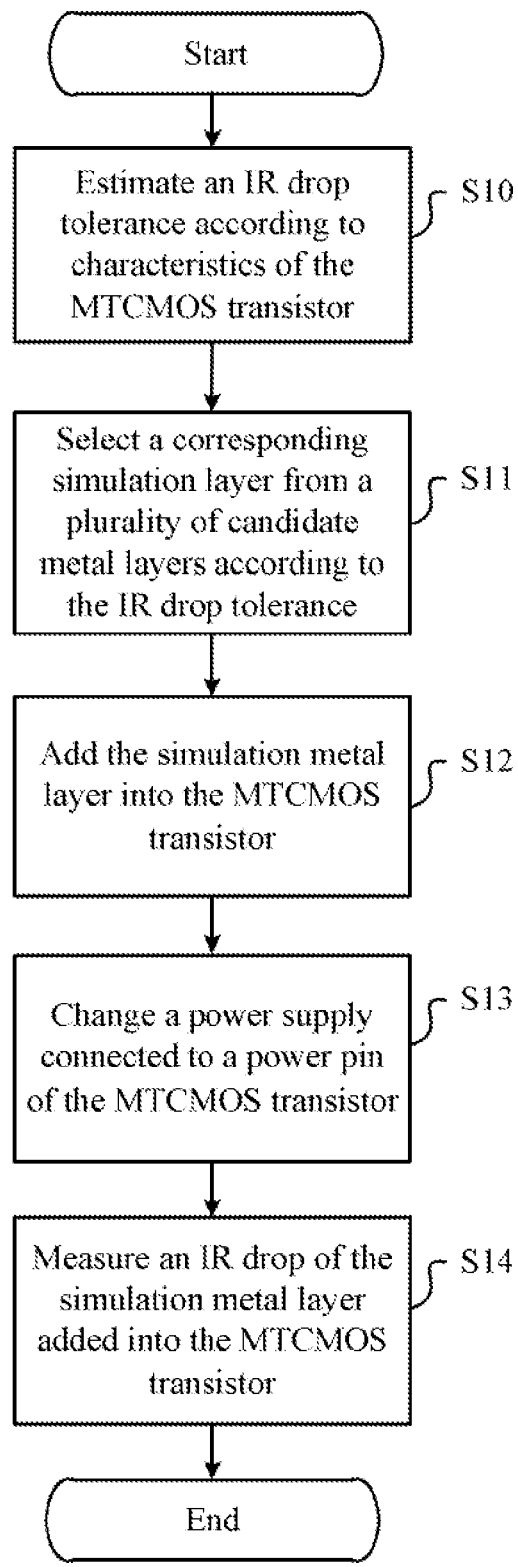
FIG. 9 is a flowchart of a static IR (voltage) drop analyzing method according to a second embodiment of the invention.

FIG. 9 shows a flowchart of the static IR (voltage) drop analyzing method according to this embodiment of the invention. The method starts with Step S10 to estimate an IR (voltage) drop tolerance according to characteristics of the MTCMOS transistor. For example, the IR (voltage) drop tolerance is estimated according to characteristics of the MTCMOS transistor using a common SPICE tool, or other common known simulation tools.

In Step S11, a corresponding simulation layer is selected from a plurality of candidate metal layers according to the IR (voltage) drop tolerance. In practice, the plurality of candidate simulation layers and corresponding IR (voltage) drop tolerances are pre-stored in a lookup table, which also records, for example, sizes and resistances of the candidate simulation layers.

The method proceeds to Step S12, in which the simulation metal layer is added into the MTCMOS transistor. More specifically, the simulation metal layer is coupled between a constant VDD and a switched VDD so that the originally separated constant VDD and switched VDD are shorted through the simulation metal layer.

In Step S13, a power supply connected to a power pin of the MTCMOS transistor is changed. In this embodiment, the power supply connected to the power pin of the MTCMOS is changed from the switched VDD to the constant VDD.

In Step S14, an IR (voltage) drop of the simulation metal layer added into the MTCMOS transistor is measured. It is to be noted that, since the constant VDD and the switched VDD are coupled and shorted through the simulation metal layer, a static IR (voltage) drop of the MTCMOS can be accurately obtained using a common EDA tool. More specifically, the IR (voltage) drop measured by the measuring module is substantially the static IR (voltage) drop of the MTCMOS transistor.

For example, supposing the estimation module 30 estimates an IR (voltage) drop tolerance ΔV of the MTCMOS transistor to be 3%, a simulation metal layer M corresponding to an IR (voltage) drop of 3% is selected from a plurality of recorded candidate simulation metal layers, and it is also obtained that a width and a resistance of the metal layer M are 0.06 μm and 0.067Ω, respectively.

A simulation metal layer N is coupled between the constant VDD and the switched VDD so that the constant VDD and the switched VDD are shorted, and a power supply connected to a power pin of the MTCMOS transistor is changed from the original switched VDD to the constant VDD. The static IR (voltage) drop of the MTCMOS transistor can then be accurately measured using a common EDA tool.

According to the static IR (voltage) drop analyzing apparatus and associated method of the invention, an IR (voltage) drop tolerance of the MTCMOS transistor is first estimated with a common Simulation Program with Integrated Circuit Emphasis (SPICE) tool, and a simulation metal layer corresponding to the estimated IR (voltage) drop tolerance is then added to the MTCMOS transistor, so that originally separated constant VDD and switched VDD become coupled and shorted via the simulation metal layer to allow accurate measurement of the static IR (voltage) drop of the MTCMOS transistor.

Therefore, with the aid of a common EDA tool, the static IR (voltage) drop analyzing apparatus and associated method provided by the present invention is capable of accurately measuring the static IR (voltage) drop of the MTCMOS transistor, thereby saving significant additional cost previous required for particular analyzing software tools as in the prior art.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A static voltage drop analyzing apparatus, for measuring a static IR (voltage) drop of a multi-threshold complementary-metal-oxide-semiconductor (MTCMOS) transistor, having a gate terminal and a drain terminal, the apparatus comprising:
   an estimation module, for estimating a voltage drop tolerance according to voltage drop characteristics of said MTCMOS transistor;
   a processor, coupled to the estimation module, for selecting a simulation metal layer from a plurality of candidate simulation metal layers according to the voltage drop tolerance, and adding the selected simulation metal layer to said MTCMOS transistor, coupling said gate terminal to said drain terminal; and
   a measuring module, for measuring a voltage drop of said simulation layer added into said MTCMOS transistor;
   wherein, the voltage drop measured by the measuring module is a static voltage drop of said MTCMOS transistor, said MTCMOS transistor is disposed in a power gating circuit comprising a switched supply voltage (VDD) for said drain terminal of said MTCMOS transistor and a constant VDD for said gate terminal of said MTCMOS transistor, and the estimation module executes a Simulation Program with Integrated Circuit Emphasis (SPICE) tool to simulate voltage drop characteristics of the MTCMOS transistor to estimate the voltage drop tolerance.

2. The apparatus as claimed in claim 1, further comprising:
   a switch module, coupled to the processor and said MTCMOS transistor, for changing a power connected to a power pin of said MTCMOS transistor from the switched VDD to the constant VDD.

3. The apparatus as claimed in claim 1, wherein the processor couples the simulation metal layer between the gate terminal and the drain terminal so as to short the gate terminal and the drain terminal.

4. The apparatus as claimed in claim 1 wherein the measuring module measures the voltage drop of the simulation metal layer using a Electronic Design Automation (EDA) tool.

5. The apparatus as claimed in claim 1, wherein the plurality of candidate simulation metal layers and corresponding voltage drop tolerances are pre-stored in a lookup table.

6. The apparatus as claimed in claim 5, wherein the lookup table further records sizes and resistances of the plurality of candidate simulation metal layers, and the processor obtains the sizes and the resistances of the plurality of simulation metal layers when selecting the simulation metal layer and disposes the simulation metal layers into the MTCMOS transistor according to the size and the resistance of the simulation layer.

7. A static voltage drop analyzing method, for measuring a static voltage drop of multi-threshold complementary-metal-oxide-semiconductor (MTCMOS) transistor, having a gate terminal and a drain terminal, the method comprising:

estimating a static voltage drop according to voltage drop characteristics of the MTCMOS transistor;

selecting a simulation metal layer from a plurality of candidate simulation metal layers according to a voltage drop tolerance;

adding the selected simulation metal layer into the MTCMOS transistor, coupling said gate terminal to said drain terminal; and measuring a voltage drop of the simulation metal layer added into the MTCMOS transistor;

wherein, the measured voltage drop is the static voltage drop of the MTCMOS transistor, said MTCMOS transistor is disposed in a power gating circuit comprising a switched voltage (VDD) for said drain terminal on said MTCMOS transistor and a constant VDD for said gate terminal on said MTCMOS transistor, and said step of estimating the static voltage drop according to voltage drop characteristics of the MTCMOS transistor comprises estimating a voltage drop tolerance by simulating voltage drop characteristics of the MTCMOS transistor using a Simulation Program with Integrated Circuit Emphasis (SPICE) tool.

8. The method as claimed in claim 7, after the step of adding the simulation metal layer into the MTCMOS transistor, further comprising:

changing a power supply connected to a power pin of the MTCMOS transistor from the switched VDD to the constant VDD.

9. The method as claimed in claim 7, wherein a processor couples the simulation metal layer between the gate terminal and the drain terminal so as to short the gate terminal and the drain terminal.

10. The method as claimed in claim 9, wherein the measuring the voltage drop of the simulation metal layer step measures the voltage drop of the simulation metal layer using a Electronic Design Automation (EDA) tool.

11. The method as claimed in claim 7, wherein selecting a simulation metal layer step further comprises obtaining a size and a resistance of the simulation metal layer, and disposing the simulation metal layer into the MTCMOS transistor according to the size and the resistance.

* * * * *